US010381311B2

(12) United States Patent
Meyer

(10) Patent No.: US 10,381,311 B2
(45) Date of Patent: Aug. 13, 2019

(54) METHOD OF ARRANGING A PLURALITY OF SEMICONDUCTOR STRUCTURAL ELEMENTS ON A CARRIER AND CARRIER COMPRISING A PLURALITY OF SEMICONDUCTOR STRUCTURAL ELEMENTS

(71) Applicant: OSRAM Opto Semiconductors GmbH, Regensburg (DE)

(72) Inventor: Tobias Meyer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/747,448

(22) PCT Filed: Aug. 3, 2016

(86) PCT No.: PCT/EP2016/068550
§ 371 (c)(1),
(2) Date: Jan. 25, 2018

(87) PCT Pub. No.: WO2017/021451
PCT Pub. Date: Feb. 9, 2017

(65) Prior Publication Data
US 2018/0247896 A1    Aug. 30, 2018

(30) Foreign Application Priority Data
Aug. 6, 2015 (DE) .................. 10 2015 112 962

(51) Int. Cl.
*H01L 21/76* (2006.01)
*H01L 23/58* (2006.01)
*H01L 23/544* (2006.01)
*B81C 99/00* (2010.01)
*H01L 21/67* (2006.01)
*H01L 21/66* (2006.01)

(52) U.S. Cl.
CPC .......... *H01L 23/544* (2013.01); *B81C 99/007* (2013.01); *H01L 21/67282* (2013.01); *H01L 22/10* (2013.01); *H01L 2223/54413* (2013.01); *H01L 2223/54433* (2013.01); *H01L 2223/54453* (2013.01)

(58) Field of Classification Search
CPC ............. H01L 21/67282; H01L 23/544; B81C 99/007
USPC ............................................ 438/401; 257/48
See application file for complete search history.

(56) References Cited

U.S. PATENT DOCUMENTS

2005/0275068 A1   12/2005   Brambilla et al.
2006/0063286 A1    3/2006   Bidermann et al.
(Continued)

FOREIGN PATENT DOCUMENTS

DE    690 32 740 T2    6/1999
DE    102 19 346 A1    11/2003
(Continued)

*Primary Examiner* — David S Blum
(74) *Attorney, Agent, or Firm* — DLA Piper LLP (US)

(57) ABSTRACT

A method of arranging a plurality of semiconductor structural elements on a carrier includes arranging at least some of the semiconductor structural elements in multiple groups G and at least one semiconductor structural element of a group G has a property E that determines the position of the respective group G of semiconductor structural elements on the carrier.

20 Claims, 4 Drawing Sheets

(56) References Cited

U.S. PATENT DOCUMENTS

2008/0085588 A1  4/2008 Subramanian
2014/0110712 A1  4/2014 Saito et al.

FOREIGN PATENT DOCUMENTS

| DE | 10 2004 001 956 A | 8/2005 |
|----|-------------------|--------|
| DE | 10 2004 027 489 A1 | 12/2005 |
| DE | 10 2006 034 599 A1 | 1/2008 |
| DE | 11 2006 002 263 T5 | 7/2008 |
| EP | 2 059 112 A1 | 5/2009 |
| JP | 2002-026041 A * | 1/2002 |

* cited by examiner

METHOD OF ARRANGING A PLURALITY OF SEMICONDUCTOR STRUCTURAL ELEMENTS ON A CARRIER AND CARRIER COMPRISING A PLURALITY OF SEMICONDUCTOR STRUCTURAL ELEMENTS

TECHNICAL FIELD

This disclosure relates to a method of arranging semiconductor structural elements on a carrier and to a carrier having a plurality of semiconductor structural elements.

BACKGROUND

To produce electronic components such as, e.g., optoelectronic components or micro-electromechanical components, it is necessary, e.g., for the quality control of the components or for further processing thereof, to know the position of the components on a carrier. To be able to assign quality control data to individual components, it is advantageous if a view of only a subregion of the carrier is sufficient to enable the position of the respective components on the carrier to be determined. Independent markings on the carrier to determine the position of the components, for instance by determining coordinates on the carrier, are usually based on a distance from the coordinate origin and reduce the area for arranging components on the carrier.

There is nonetheless a need to provide a method of arranging semiconductor structural elements on a carrier and a carrier having a plurality of semiconductor structural elements that are distinguished by improved determination of the position of the semiconductor structural elements on the carrier.

SUMMARY

I provide a method of arranging a plurality of semiconductor structural elements on a carrier including arranging at least some of the semiconductor structural elements in multiple groups G and at least one semiconductor structural element of a group G has a property E that determines the position of the respective group G of semiconductor structural elements on the carrier.

I also provide a carrier having a plurality of semiconductor structural elements arranged on the carrier, wherein at least some of the semiconductor structural elements are arranged in groups G, and at least one semiconductor structural element of a group G has a property E that determines the position of the respective group G on the carrier.

I further provide a method of arranging a plurality of semiconductor structural elements on a carrier including arranging at least some of the semiconductor structural elements in multiple groups G and at least one semiconductor structural element of a group G has a property E for determining the position of the respective group G of semiconductor structural elements on the carrier, wherein the property E is a deviation from a homogeneous arrangement of semiconductor structural elements.

LIST OF REFERENCE CHARACTERS

Figure 1:
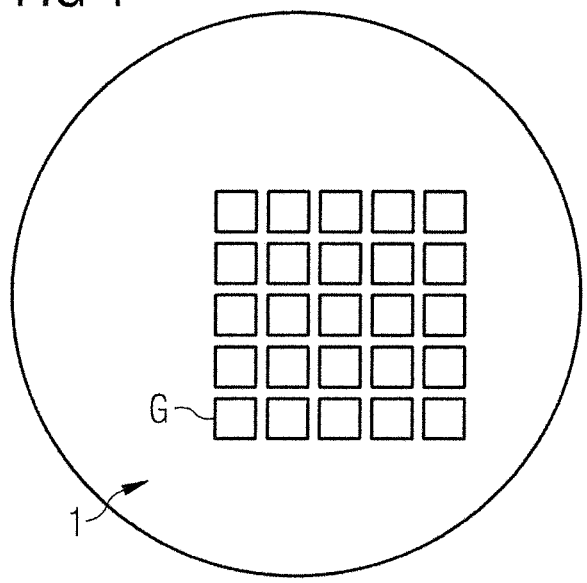
FIG. 1 shows an arrangement of semiconductor structural elements in groups on a carrier in a top view of the carrier.

1 Carrier
1a Semiconductor layer sequence
1b Further carrier
2 Semiconductor structural element
4 Demarcation
D Distance
E Property
G Group
M Marking

DETAILED DESCRIPTION

In a method of arranging a plurality of semiconductor structural elements on a carrier, at least some of the semiconductor structural elements are arranged in multiple groups G, wherein at least one semiconductor structural element of a group G has a property E to determine the position of the respective group G of semiconductor structural elements on the carrier.

The plurality of semiconductor structural elements can be any number of semiconductor structural elements. The number of the semiconductor structural elements can be very high, e.g., more than 1000, typically 20,000 to 500,000 or up to 1,000,000,000.

To identify individual semiconductor structural elements or regions of semiconductor structural elements on the carrier, each semiconductor structural element is advantageously allocated to a group, the position of each group on the carrier being known. The position of a group of semiconductor structural elements can advantageously be marked by the respective group itself. This proves advantageous because, to determine the position of a group and thus of semiconductor structural elements within this group, it is thus sufficient to see only a subregion of the carrier in which the group to be located is present, in particular the group itself. In other words, to determine the position of a group or an individual semiconductor structural element, it is not necessary to look for a marking of coordinates on the carrier but the position of the group can be read off directly from the semiconductor structural elements of the group. To this end, at least one semiconductor structural element of the group has a property E that advantageously serves to determine the position. Thus, additional markings on the carrier giving information about the position on the carrier can advantageously be omitted. In this way, losses of the area of the carrier that is usable for the arrangement of semiconductor structural elements can advantageously be reduced or avoided. Advantageously, therefore, it is unnecessary to count spacings and the number of semiconductor structural elements lying between a marking on the carrier and the semiconductor structural element of which the position on the carrier is to be determined. The determination of the position of a semiconductor structural element or of a group of semiconductor structural elements can advantageously take place easily if, when the carrier is observed, e.g., in an analytical method, only a subregion of the carrier can be captured or observed.

Furthermore, with a fixed size of the group, a semiconductor structural element can be allocated to a particular group. In this case, simplified quality controls are obtained, e.g., visual inspections of semiconductor structural elements. The semiconductor structural elements can advantageously be arranged on a carrier for inspection purposes and checked by, e.g., electrical, visual or mechanical inspections and operated by a control signal. This makes it possible to locate defective semiconductor structural elements on the carrier.

The arrangement may comprise producing a semiconductor layer sequence on the carrier and patterning it to form the semiconductor structural elements.

To produce the semiconductor structural elements, a semiconductor layer sequence can be deposited on the carrier. For example, crystal layers can be grown epitaxially. The carrier may comprise a substrate. After depositing the semiconductor layer sequence, a patterning thereof advantageously takes place, wherein, e.g., mesa structures are introduced into the semiconductor layer sequence. Isolating trenches can also advantageously be introduced into the semiconductor layer sequence that extend to the carrier and separate the semiconductor structural elements from one another. After this, further process stages can take place and the semiconductor structural elements can be provided with, e.g., metal coatings.

In the method, the arrangement may comprise producing a semiconductor layer sequence on a further carrier and patterning it to obtain the semiconductor structural elements and arranging the semiconductor structural elements, which have been removed from the further carrier, on the carrier.

A production of semiconductor structural elements can also advantageously take place on a further carrier and the semiconductor structural elements can be transferred and bonded on to the carrier after being produced. In this case it is advantageously possible that the further carrier comprises a growth substrate on which a semiconductor layer sequence is grown. After production of the one semiconductor layer sequence, this can advantageously be patterned on the further carrier such that, e.g., mesa structures are introduced into the semiconductor layer sequence. Isolating trenches can also advantageously be introduced into the semiconductor layer sequence that extend to the further carrier and separate the semiconductor structural elements from one another.

By a stripping process, the semiconductor structural elements can be removed from the further carrier and deposited on the carrier in an arrangement of groups G. The semiconductor structural elements can be bonded on to the carrier, for example.

In the method, the semiconductor structural elements may be in the form of semiconductor chips.

If the semiconductor structural elements are further processed into semiconductor chips, depending on the further processing method, the semiconductor chips can either still have or no longer have a property E which they had before being further processed into semiconductor chips. For inspection purposes, the semiconductor chips can also advantageously be arranged on a carrier and checked by, e.g., electrical, visual or mechanical inspections and operated by a control signal, wherein semiconductor chips can have a property E corresponding to the semiconductor structural elements.

In the method, a group G may comprise a matrix of n×m semiconductor structural elements, wherein n and m are each an integer and n and m are less than or equal to 100.

The selection of the size of a group is advantageously made by the number of rows and columns of a matrix, wherein the semiconductor structural elements of the respective group are advantageously arranged in a matrix. In this way, at least some, advantageously all, of the semiconductor structural elements can be arranged on the carrier in matrices with dimensions n×m. The matrices can all have the same dimension or can have different dimensions. In particular, the matrices have a dimension of 6×6, i.e., n=6 and m=6. The selection of not too large a matrix is advantageous because, when the carrier with the semiconductor structural elements is observed microscopically, the entire matrix to which the semiconductor structural element being observed is assigned is advantageously still visible. As a result, it is advantageously possible to determine the position immediately based on all the semiconductor structural elements in the group. In particular, n and m are less than or equal to 10.

A coding may be allocated to a group G, wherein the coding of the group is created based on how the semiconductor structural elements with the property E are arranged in the respective group G.

The semiconductor structural elements in a group are advantageously provided with a binary state "1" or "0" according to whether or not they have the property E. Consequently, at least one semiconductor chip from a group, in particular each semiconductor structural element in the group, is allocated a number 0 or 1. According to the arrangement of the semiconductor structural elements in the group, a sequence of numbers of 0 and 1 is obtained, corresponding to an integer in binary code. Advantageously here, the arrangement of semiconductor structural elements along the first row, then along the second row and so on up to the last semiconductor structural element of the last row, is taken into account. Alternatively, however, any other sequence of the semiconductor structural elements can also be taken into account. The semiconductor structural elements within a group having the property E can advantageously be defined during or after the arrangement of the semiconductor structural elements. By calculating and coding a checksum, an error within a group can be corrected. For example, in an arrangement of 6×6 semiconductor structural elements an error correction takes place such that the first 5×6 semiconductor structural elements correspond to the coding of the position and the last 6 semiconductor structural elements correspond to the checksum of the first 5×6 semiconductor structural elements.

Furthermore, it is possible that the semiconductor structural elements have more than one property E. Consequently, a semiconductor structural element can take on more than two states and can be provided with a ternary, quaternary or higher-order coding.

At least one semiconductor structural element of a group G may have a marking M, by which an arrangement of the semiconductor structural elements can be identified as a group G.

The marking can be, e.g., a colored label, an inscription, a surface structure or similar. The absence of a semiconductor structural element can also represent a marking. The semiconductor structural element with the marking indicates, e.g., the start of a group on the carrier. Thus, the outermost semiconductor structural element at the top left of the group can advantageously comprise the marking as the start of the group. With a known size of the group, all semiconductor structural elements belonging to the group can then be clearly allocated. Alternatively, it is possible that an arbitrary semiconductor structural element from the group comprises the marking, in which case it must be established in what region around the semiconductor structural element with the marking the semiconductor structural elements still belong to the particular group. Advantageously, all markings of all groups can be identical. It is also possible that multiple semiconductor structural elements within a group have a marking or multiple markings.

It is furthermore possible that a group is marked by multiple semiconductor structural elements having the property E. For example, within a group a 2×2 matrix with semiconductor structural elements having the property E at a specific position, for instance in the top left-hand corner of any group G, acts as a marking for the group. This advantageously results in a clear labelling of a group G. It is advantageously unnecessary for the groups G to have demarcations or enlarged spacings from one another.

An arrangement of groups G may repeat multiple times on the carrier, wherein the groups have a specific arrangement of semiconductor structural elements with the property E.

The semiconductor structural elements on the carrier can have a repeating number N of groups G on the carrier, wherein the groups of the number N each have semiconductor structural elements with properties E such that the properties E are always distributed equally within the group and the position of the group within the number of groups is always identical. For example, an adjacent arrangement of four groups repeats multiple times on the carrier, wherein in each arrangement, each of the four groups is identical with respect to the distribution of the property E and the position of the group within the arrangements. It is advantageously possible to find the arrangement of four groups, i.e., the repeating number N, on the carrier easily during an analytical method and to use them for position determination. Formation of the repeating number N can take place, e.g., by lithographic methods.

The groups G may be arranged on the carrier such that adjacent groups are at a distance from one another which is greater than the distance between the semiconductor structural elements within a group.

To separate adjacent groups on the carrier, the distance between the groups can advantageously be formed such that a demarcation of the groups from one another is clearly recognizable. This can advantageously be achieved by arranging semiconductor structural elements within the groups at a distance from one another advantageously smaller than the distance of the groups from one another. It is advantageously possible here to arrange the semiconductor structural elements within the groups at the same distances from one another so that the association of the respective semiconductor structural elements with the corresponding group can be made quickly and easily.

A demarcation between the groups G may be arranged on the carrier.

Advantageously, a demarcation is arranged at least between two groups. It is also possible to arrange a demarcation between all groups on the carrier. The demarcation can also be arranged around at least one group, surrounding it. Advantageously, the groups between which a demarcation is arranged are at no greater distance from one another than when no demarcation is present between the respective groups. One group can advantageously be separated from another by a demarcation.

The property E may be a brightness or a brightness level of the semiconductor structural element or a subregion of a semiconductor structural element.

If the brightness of the semiconductor structural element is determined to be the property E to determine the position of the group of semiconductor structural elements on the carrier, the information on whether the semiconductor structural element appears bright or dark can advantageously be used for each semiconductor structural element from the respective group. For example, each group can be allocated a binary code relating to the arrangement of semiconductor structural elements appearing bright and dark in the group. The arrangement of the semiconductor chips appearing bright and dark can advantageously be predefined to enable the position of the respective group to be determined. Furthermore, the semiconductor structural element can also have a brightness level such as bright, medium-bright and dark, or further intermediate steps, wherein the individual brightness levels correspond to one of the properties E.

The property E may be a geometric shape of the semiconductor structural element.

The semiconductor structural elements or the subregions thereof can advantageously have a predefined shape or, in principle, any shape, seen in a top view. With respect to the property E of the semiconductor structural element contributing to position determination, or a subregion thereof, the predefined shape can be, e.g., a rectangular, circular, elliptical or step shape. Other shapes are also possible. Again, each arrangement of semiconductor structural elements within a group can advantageously be allocated a coding.

The property E may be a deviation from a homogeneous arrangement of semiconductor structural elements.

The semiconductor structural elements can advantageously be arranged within a group in rows and columns of a matrix. Furthermore, it is possible that individual semiconductor structural elements are arranged such that they are displaced from the straight arrangement within a row. The semiconductor structural elements within a group can differ from one another, e.g., only by whether or not they are positionally displaced in a row. The displacement can advantageously take place in any direction of the two-dimensional carrier, a semiconductor structural element being displaced only by a distance advantageously smaller than the distance between the semiconductor structural elements within a group. A displaced semiconductor structural element thus has the property E to determine the position on the carrier. Again, each arrangement of semiconductor structural elements within a group can advantageously be allocated a coding with respect to the property E.

The property E may be a rotated arrangement of the semiconductor structural element.

The semiconductor structural elements can advantageously be arranged in a matrix in a group, wherein those semiconductor structural elements which, in a top view of the carrier, are rotated about an axis, the axis being perpendicular to the carrier, have the property E. The rotation of the semiconductor structural elements can advantageously be equal for all semiconductor structural elements with the property E, equal within only one group or different within a group. The property E can also advantageously be recognized only as a rotation per se or different angles of rotation can be taken into account. Again, each arrangement of semiconductor structural elements within a group can advantageously be allocated a coding.

Patterning of the semiconductor layer sequence may take place by an etching process.

By an etching process, the semiconductor layer sequence can be provided with isolating trenches or mesa structures. It is furthermore possible that individual semiconductor structural elements are removed. In this way, an absence of a semiconductor structural element can also be used as a marking, for instance of a group G.

The carrier comprises a plurality of semiconductor structural elements arranged on the carrier, wherein at least some of the semiconductor structural elements are arranged in groups G and at least one semiconductor structural element of a group G has a property E to determine the position of the respective group G on the carrier.

The plurality of semiconductor structural elements can be any number of semiconductor structural elements advantageously connected on the carrier to emit light. The semiconductor structural elements can comprise, e.g., semiconductor chips such as for instance light-emitting diodes. The arrangement of the semiconductor structural elements on the carrier advantageously allows simplified quality controls, e.g., visual inspections of semiconductor chips. The semiconductor structural elements can be inspected, e.g., by photoluminescence, electron beam microscopy or surface analyses. The semiconductor structural elements can advantageously be operated on a carrier by a control signal for inspection purposes. It is possible that the position is determined by a first analytical stage, e.g., by optical microscopy, and in a further stage a quality control or a processing of the semiconductor structural elements takes place.

The number of semiconductor structural elements can be very high, e.g., more than 1000, typically 20,000 to 500,000 or up to 1,000,000,000.

Further advantageous examples of the carrier and associated advantages can be taken from the description of the method and are therefore not explained again.

According to at least one example of the carrier, the groups G are arranged on the carrier at a distance from one another, the distance being greater than the distance between the semiconductor structural elements within a group G.

To separate adjacent groups on the carrier, a distance can advantageously be formed between the groups such that a demarcation of the groups from one another is clearly recognizable. It is advantageously possible in this case that the semiconductor structural elements within the groups are arranged at the same distances from one another so that a clear association of the respective semiconductor structural elements with the corresponding group is obtained.

A demarcation may be arranged between the groups G on the carrier.

A demarcation of groups from one another can advantageously be achieved by a demarcation arranged at least between two adjacent groups or between multiple groups or surrounding all groups. Advantageously, the groups between which a demarcation is arranged are either at no greater distance from one another than when no demarcation is present between the respective groups or the demarcation is arranged in a widened distance between the adjacent groups.

By a demarcation, one group can advantageously be separated from another or a group can be demarcated from an arbitrarily arranged quantity of semiconductor structural elements.

Further advantages, advantageous developments can be taken from the examples described below in association with the figures.

Identical elements or elements having the same effect are each provided with the same reference character in the figures. The components illustrated in the figures and the size ratios to one another of the components should not be considered as being to scale.

FIG. 1 shows a top view of a carrier 1, wherein the carrier 1 can advantageously be a wafer. On the carrier 1, groups G of semiconductor structural elements are arranged. FIG. 1 shows an arrangement in which all the semiconductor structural elements of the carrier 1 are arranged in groups G. Consequently, each semiconductor structural element that is arranged on the carrier 1 can advantageously be assigned to a group G. The groups G are arranged in a rectangular pattern. Alternatively, it is also possible that a plurality of groups G are arranged in an arbitrary manner on the carrier 1. The carrier 1 in FIG. 1 is circular but can be any shape.

Figure 2:
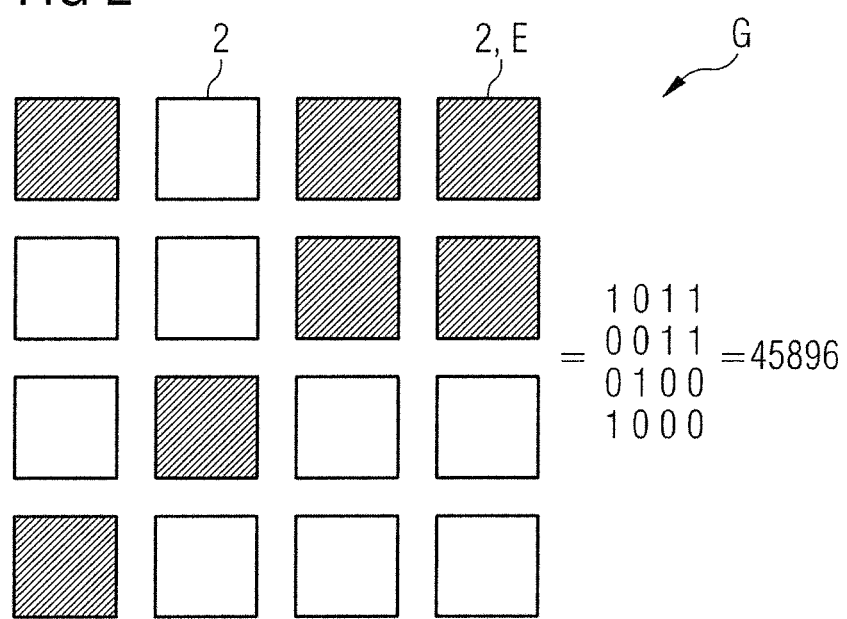
FIG. 2 shows semiconductor structural elements in a group.

FIG. 2 shows an arrangement of semiconductor structural elements 2 within a group G, wherein the semiconductor structural elements 2 form a matrix with 4 rows and 4 columns. Some of the semiconductor structural elements 2 of the group G have a property E. The property E is, e.g., the brightness of the particular semiconductor structural element 2. Thus, for instance, the property E can be assigned to a semiconductor structural element 2 if the semiconductor structural element appears dark. The reverse case is also possible, should the property be defined as a bright appearance of the semiconductor structural element. From an arrangement of semiconductor structural elements 2 having the property E as semiconductor structural elements appearing dark, the group G can be assigned a binary code. Thus, according to FIG. 2 the first row with, from the left, a sequence of a dark, a bright, a dark and another dark semiconductor structural element is registered as binary code 1011 for the first row. For the second row, a binary code of 0011 is obtained, for the third row 0100 and for the fourth row 1000. After stringing together the binary codes for the rows, an overall code of 1011001101001000 is obtained, which can be converted to a decimal number of 45896. If the position on the carrier at which the group G with the code 45896 is arranged is known, this can be located on the carrier by observing the group without seeing further groups or a marking on the carrier from which coordinates on the carrier could be read off. In this way, each group G can advantageously be allocated its own binary code for position determination and each semiconductor structural element in this group can be located on the carrier.

Figure 3:
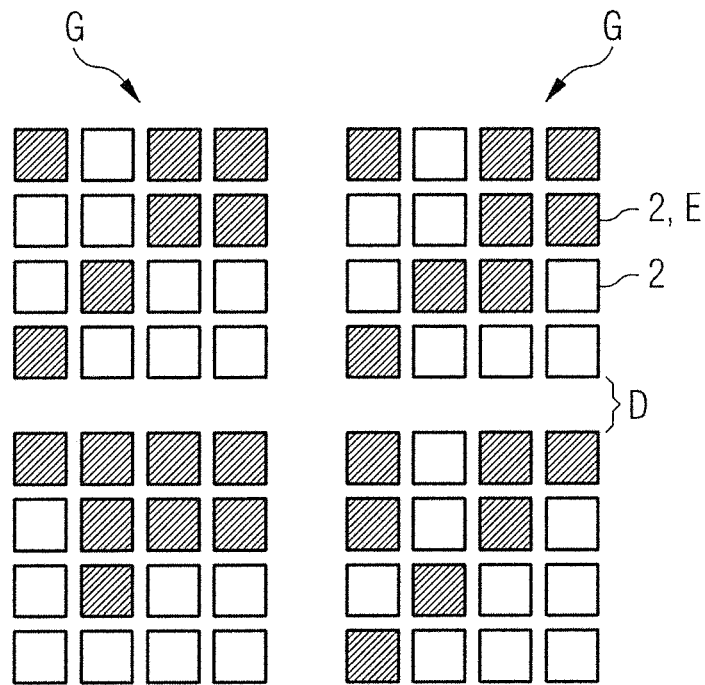
FIGS. 3, 4, 5A and 5B show the arrangement of groups in relation to one another.

FIG. 3 shows four groups G of semiconductor structural elements 2 in a top view, wherein the groups are each at a distance D from one another. The distance D is advantageously greater than the distance of the semiconductor structural elements 2 from one another within a group G. Each group comprises an arrangement of semiconductor structural elements 2 in four rows and four columns. Some of the semiconductor structural elements 2 within a group G advantageously have a property E. According to the arrangement of semiconductor structural elements 2 with the property E in a group G, each group can be allocated a binary code, the codes for each group differing from one another. The distance D advantageously enables each semiconductor structural element 2 to be assigned to a group G.

Figure 4:
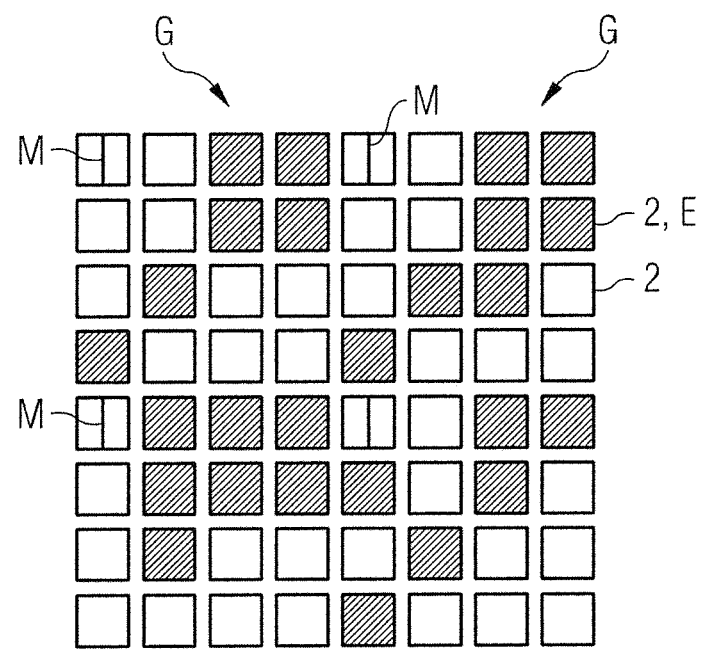

FIG. 4 shows the four groups G of semiconductor structural elements 2 from FIG. 3, wherein the distance D between the groups G is no greater than the distance of the semiconductor structural elements 2 from one another within a group G. In this way, a space-saving arrangement of semiconductor structural elements 2 on a carrier is advantageously achieved. However, demarcation of the groups G from one another is made more difficult. The group has a marking M, which advantageously indicates the start of a group G of semiconductor structural elements 2. For example, the first semiconductor structural element 2 arranged in the top left-hand corner of the matrix of a group, has the marking M in each case. The marking can alternatively be arranged on any semiconductor structural element 2. The marking M can comprise lettering, a vertical line or similar. It is advantageously unnecessary for the semiconductor structural element 2 provided with the marking M to have the property E. However, it is also possible that the semiconductor structural element 2 with the marking also has the property E.

Figure 5A:
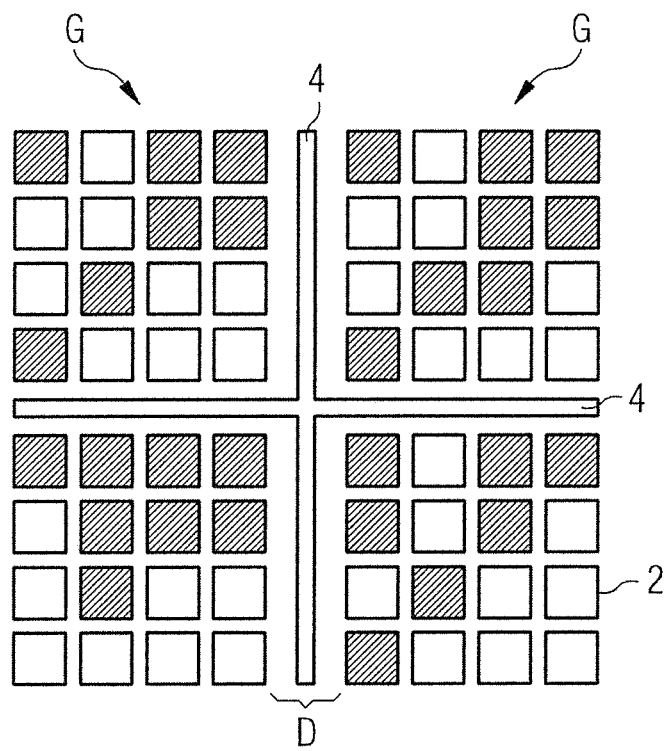

FIG. 5A shows the four groups G of semiconductor structural elements 2 from FIG. 3, wherein a distance D is present between the groups G and a demarcation 4 is arranged between the groups. In FIG. 5A, the distance D is not widened as a result of the demarcation 4, but an increase or decrease in the distance D is possible here. The groups G are clearly demarcated from one another by the demarcation 4.

Figure 5B:
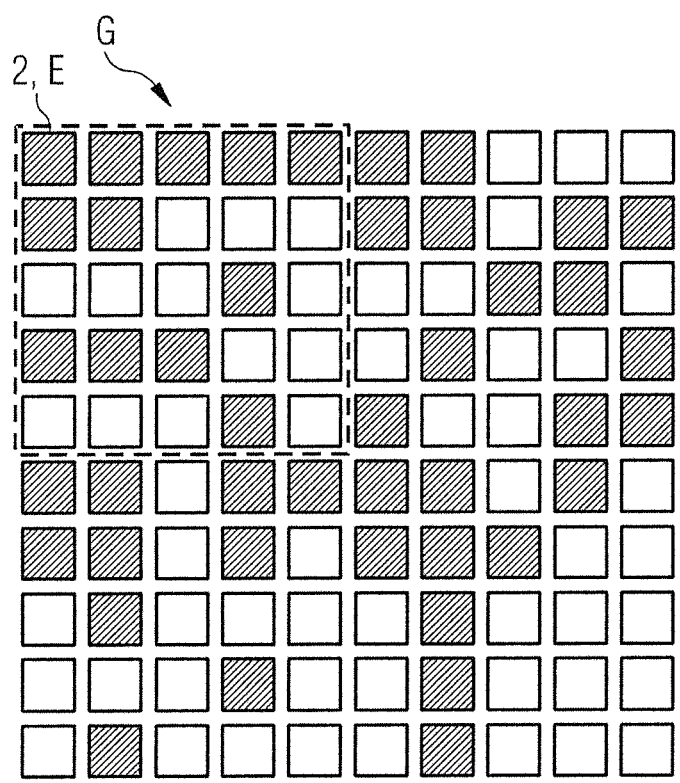

FIG. 5B shows four groups G of semiconductor structural elements 2, wherein a marking of a group takes place with semiconductor structural elements 2 having the property E. A 2×2 matrix in the top left-hand corner of each group G advantageously comprises semiconductor structural elements 2 all of which appear dark, wherein a semiconductor structural element 2 appearing dark is registered as having the property E. This advantageously results in a clear labelling of a group G. It is advantageously unnecessary for the groups G to have demarcations or increased distances from one another. In FIG. 5B, a group G is labelled with a broken line for illustration purposes only. To label a group, the 2×2 matrix with the semiconductor structural elements 2 appearing dark is advantageously not repeated at other positions within the same group G and is also not repeated within the same group together with the semiconductor structural elements located at the edge of the adjacent groups. Alternatively, other specific arrangements of chips with property E occurring only at the start of a group are also possible.

Figure 6A:
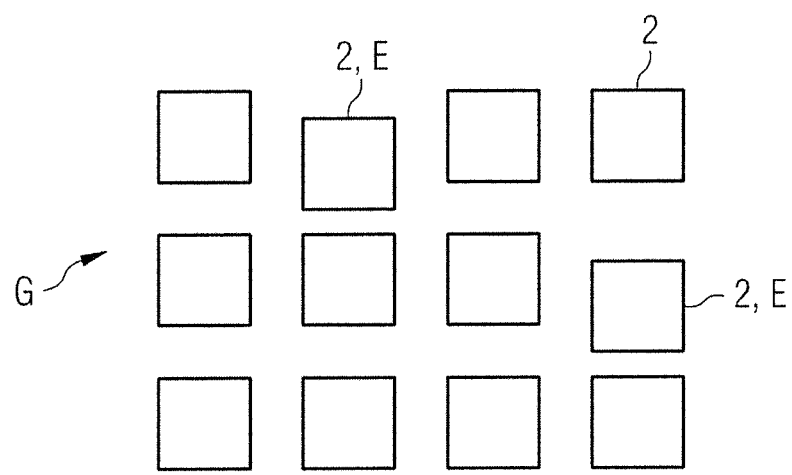
FIGS. 6A and 6B show further possible arrangements of semiconductor structural elements on the carrier.

FIG. 6A shows an arrangement of semiconductor structural elements 2 in a matrix of a group G. The property E for position determination comprises a semiconductor structural element 2 displaced from a straight arrangement in a row of the matrix. The displacement is advantageously smaller than the mutual distance between the semiconductor structural elements 2 within the matrix and large enough for the displacement to be immediately recognizable when the matrix is observed. The displacement of the semiconductor structural elements 2 with the property E takes place in FIG. 6A from the row in which the respective semiconductor structural element 2 is arranged towards the adjacent row there below.

Figure 6B:
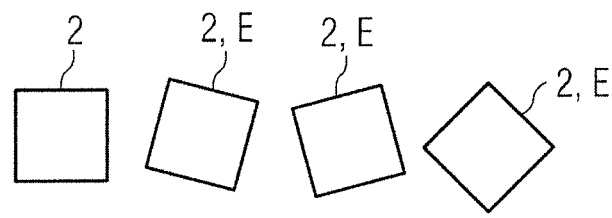

FIG. 6B shows semiconductor structural elements 2, wherein the semiconductor structural elements 2 have a property E for position determination if they are rotated relative to a semiconductor structural element 2 arranged straight such as the semiconductor structural element on the extreme left in FIG. 6B. The direction of rotation is advantageously arbitrary and can comprise different angles of rotation. It is advantageously possible that the rotation of a semiconductor structural element 2 is, by itself, sufficient to assign the property E thereto. Thus, the respective semiconductor structural elements do not all have to be rotated by exactly the same angles of rotation in the same direction to have the property E. Furthermore, it is possible that specific angles of rotation constitute the properties E and are assigned to the semiconductor structural elements.

The description of my methods and carriers with the aid of the examples does not limit this disclosure thereto. Rather, this disclosure comprises any new feature and any combination of features, which in particular includes any combination of features in the appended claims, even if the feature or combination is not itself explicitly stated in the claims or examples.

This application claims priority of DE 10 2015 112 962.0, the subject matter of which is incorporated herein by reference.

The invention claimed is:

1. A method of arranging a plurality of semiconductor structural elements on a carrier comprising arranging at least some of the semiconductor structural elements in multiple groups G and at least one semiconductor structural element of a group G has a property E that determines the position of the respective group G of semiconductor structural elements on the carrier, wherein a coding is assigned to a group G, and the coding for the group is created based on how the semiconductor structural elements with the property E are arranged in the respective group G.

2. The method according to claim 1, wherein the arranging comprises producing a semiconductor layer sequence on the carrier and patterning it to form the semiconductor structural elements.

3. The method according to claim 1, wherein the arranging comprises producing a semiconductor layer sequence on a further carrier and patterning it to form the semiconductor structural elements and arranging the semiconductor structural elements that have been removed from the further carrier on the carrier.

4. The method according to claim 1, wherein the semiconductor structural elements are in the form of semiconductor chips.

5. The method according to claim 1, wherein a group G comprises a matrix of n×m semiconductor structural elements, wherein n and m are each an integer and n and m are less than or equal to 100.

6. The method according to claim 1, wherein at least one semiconductor structural element of a group G has a marking M by which an arrangement of semiconductor structural elements can be identified as a group G.

7. The method according to claim 1, wherein an arrangement of groups G, wherein the groups have a specific arrangement of semiconductor structural elements with the property E, repeats multiple times on the carrier.

8. The method according to claim 1, wherein the groups G are arranged on the carrier such that adjacent groups are at a distance from one another greater than the distance between the semiconductor structural elements within a group G.

9. The method according to claim 1, wherein a demarcation is arranged between the groups G on the carrier.

10. The method according to claim 1, wherein the property E is a brightness or a brightness level of the semiconductor structural element or a subregion of the semiconductor structural element.

11. The method according to claim 1, wherein the property E is a geometric shape of the semiconductor structural element.

12. The method according to claim 1, wherein the property E is a deviation from a homogeneous arrangement of semiconductor structural elements.

13. The method according to claim 1, wherein the property E is a rotated arrangement of the semiconductor structural element.

14. The method according to claim 1, wherein the patterning of the semiconductor layer sequence takes place by an etching process.

15. A carrier having a plurality of semiconductor structural elements arranged on the carrier, wherein
at least some of the semiconductor structural elements are arranged in groups G, and
at least one semiconductor structural element of a group G has a property E that determines the position of the respective group G on the carrier.

16. The carrier according to claim 15, wherein the groups G are arranged at a distance from one another on the carrier, and the distance is greater than the distance between the semiconductor structural elements within a group G.

17. The carrier according to claim 15, wherein a demarcation is arranged between the groups G on the carrier.

18. The carrier according to claim 16, wherein a demarcation is arranged between the groups G on the carrier.

19. A method of arranging a plurality of semiconductor structural elements on a carrier comprising arranging at least some of the semiconductor structural elements in multiple groups G and at least one semiconductor structural element of a group G has a property E for determining the position of the respective group G of semiconductor structural elements on the carrier, wherein the property E is a deviation from a homogeneous arrangement of semiconductor structural elements.

20. The method according to claim 1, wherein the coding comprises a binary code.

\* \* \* \* \*